(12) United States Patent
Shimomura et al.

(10) Patent No.: US 8,884,514 B2
(45) Date of Patent: *Nov. 11, 2014

(54) PHOSPHOR COMPOSITION, LIGHT-EMITTING DEVICE HAVING THE SAME, CURED PRODUCT HAVING THE SAME, LIGHTING SYSTEM HAVING THE SAME, AND DISPLAY HAVING THE SAME

(71) Applicants: Yasuo Shimomura, Kanagawa (JP); Hideaki Kaneda, Ibaraki (JP); Naoto Kijima, Kanagawa (JP)

(72) Inventors: Yasuo Shimomura, Kanagawa (JP); Hideaki Kaneda, Ibaraki (JP); Naoto Kijima, Kanagawa (JP)

(73) Assignee: Mitsubishi Chemical Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/831,945

(22) Filed: Mar. 15, 2013

(65) Prior Publication Data

US 2013/0200779 A1 Aug. 8, 2013

Related U.S. Application Data

(63) Continuation of application No. 13/073,231, filed on Mar. 28, 2011, now Pat. No. 8,427,044, which is a continuation of application No. 11/631,103, filed as application No. PCT/JP2005/011941 on Jun. 29, 2005, now abandoned.

(30) Foreign Application Priority Data

Jun. 30, 2004 (JP) ................................. 2004-194509

(51) Int. Cl.
*H05B 33/14* (2006.01)
*C09K 11/08* (2006.01)
(Continued)

(52) U.S. Cl.
CPC ............. *C09K 11/64* (2013.01); *C09K 11/7734* (2013.01); *C09K 11/7774* (2013.01); *H01L*
(Continued)

(58) Field of Classification Search
USPC ....................... 252/301.4 F; 313/503
See application file for complete search history.

(56) References Cited

U.S. PATENT DOCUMENTS 3,937,998 A 2/1976 Verstegen et al.
5,118,985 A 6/1992 Patton et al.
(Continued)

FOREIGN PATENT DOCUMENTS

CN 1438525 8/2003
JP 2003 64358 3/2003
(Continued)

OTHER PUBLICATIONS

Machine translation of Shimomoura et al. JP 2003-064358 A.*

(Continued)

*Primary Examiner* — Nimeshkumar Patel
*Assistant Examiner* — Steven Horikoshi
(74) *Attorney, Agent, or Firm* — Oblon, Spivak, McClelland, Maier & Neustadt, L.L.P.

(57) ABSTRACT

To enhance luminance and color rendering of a light emitting device comprising phosphors as wavelength converting material and at least one semiconductor light emitting device that emits visible light, as said phosphors, are used phosphors which are one or more kinds of phosphors selected from a group consisting of oxides, oxynitrides and nitrides, and are a mixture consisting of two or more kinds of phosphors whose luminous efficiency is 35% or higher when excited by the visible light from said semiconductor light emitting device at room temperature. In addition, said mixture contains a first phosphor, and a second phosphor that is different from said first phosphor and capable of absorbing emitted light from said first phosphor, and said first phosphor is contained 85 weight % or more of said mixture of phosphors.

15 Claims, 1 Drawing Sheet

(51) Int. Cl.
  *C09K 11/59* (2006.01)
  *C09K 11/77* (2006.01)
  *H01L 33/50* (2010.01)
  *C09K 11/64* (2006.01)
  *H05B 33/12* (2006.01)

(52) U.S. Cl.
  CPC ............ 2224/45144 (2013.01); *C09K 11/0883* (2013.01); *H01L 2224/48091* (2013.01); *H01L 33/504* (2013.01); *H05B 33/12* (2013.01); *H01L 2224/48247* (2013.01)
  USPC .................................... 313/503; 252/301.4 F (56) References Cited

U.S. PATENT DOCUMENTS

| | | | |
|---|---|---|---|
| 5,611,959 | A | 3/1997 | Kijima et al. |
| 6,153,971 | A | 11/2000 | Shimizu et al. |
| 6,466,135 | B1 | 10/2002 | Srivastava et al. |
| 6,501,100 | B1 | 12/2002 | Srivastava et al. |
| 6,712,993 | B2 | 3/2004 | Kijima et al. |
| 7,001,537 | B2 | 2/2006 | Kijima et al. |
| 7,006,172 | B2 | 2/2006 | Kawana et al. |
| 7,252,788 | B2 | 8/2007 | Nagatomi et al. |
| 7,477,009 | B2 | 1/2009 | Nagatomi et al. |
| 7,573,190 | B2 | 8/2009 | Hirosaki et al. |
| 8,269,410 | B2 * | 9/2012 | Kijima et al. ............... 313/501 |
| 8,427,044 | B2 * | 4/2013 | Shimomura et al. ......... 313/503 |
| 2003/0094893 | A1 | 5/2003 | Ellens et al. |
| 2005/0145854 | A1 | 7/2005 | Seto et al. |
| 2005/0189863 | A1 | 9/2005 | Nagatomi et al. |
| 2007/0007494 | A1 | 1/2007 | Hirosaki et al. |
| 2012/0267997 | A1 | 10/2012 | Kijima et al. |

FOREIGN PATENT DOCUMENTS

| | | |
|---|---|---|
| JP | 2003 133595 | 5/2003 |
| JP | 2003 243715 | 8/2003 |
| JP | 2004 134805 | 4/2004 |
| JP | 2005 109085 | 4/2005 |
| JP | 2005-235934 | 9/2005 |
| JP | 2005-239985 | 9/2005 |
| JP | 2005 243669 | 9/2005 |
| JP | 2006-8721 | 1/2006 |
| JP | 2006 8721 | 1/2006 |
| KR | 10-2004-0018085 | 3/2004 |
| WO | 2006 003930 | 1/2006 |
| WO | 2006 003931 | 1/2006 |

OTHER PUBLICATIONS

K. Uheda, et al., "Aluminum Silicon Nitride doped with Divalent Europium", Oct. 3-Oct. 8, 2004, The Electrochemical Society, 2004 Joint International Meeting.
National Institute for Material Science, "Success in Development of Red Phosphor for White LED", Aug. 31, 2004 (with English translation).
Presentation by the Japan Society of Applied Physics, Sep. 2, 2004 (with English translation).
K. Uheda, et al., "The Crystal Structure and Photoluminscence Properties of a New Red Phosphor, Calcium Aluminum Silicone Nitride doped with Divalent Eropium CaAlSiN$_3$:Eu$^{2+}$", Oct. 3-Oct. 8, 2004, 2004 Joint International Meeting, ECS.
Office Action issued Mar. 15, 2011 in Japanese Patent Application No. 2004-194509 (with English translation).
Rong-Jun Xie, et al., "Preparation and Luminescence Spectra of Calcium- and Rare-Earth (R=Eu, Tb, and Pr)-Codoped α-SiAlON Ceramics", J. Am. Ceram. Soc., vol. 85, No. 5, 2002, pp. 1229-1234.
Naoto Hirosaki, et al., "Sialon Phosphors", Lecture Manuscripts of the Assorted Lecture Meeting Related to the Applied Physics, vol. 51, No. 3, p. 1610, 2004 (with partial English translation).
Kazuaki Ohkubo, et al., "Absolute Fluorescent Quantum Efficiency of NBS Phosphor Standard Samples", Journal of the Iluuminating Engineering Institute of Japan, vol. 83, No. 2, pp. 87-93, 1999.
Kazuo Narita, "Relative Quantum Efficiency of Various Lamp Phosphors", Journal of the Illuminating Engineering Institute of Japan, vol. 69, No. 2, pp. 65-69, 1985 (with English abstract).
Kyota Uheda, et al., "Luminescence Properties of the Red Nitride Phosphor, CaAlSiN3: Eu2+", Lecture Manuscripts of the Assorted Lecture Meeting Related to the Applied Physics, vol. 65, No. 3, pp. 1282-1283, 2004 (with partial English translation).
Young-Duk Huh, et al., "Optical Properties of the Three-Band White Light Emitting Diodes", Journal of the Electrochemical Society, vol. 150, No. 2, pp. H57-H60, 2003.
Supplementary European Search Report issued Jun. 13, 2014, in corresponding European Patent Application No. 05764522.0.

* cited by examiner

PHOSPHOR COMPOSITION, LIGHT-EMITTING DEVICE HAVING THE SAME, CURED PRODUCT HAVING THE SAME, LIGHTING SYSTEM HAVING THE SAME, AND DISPLAY HAVING THE SAME

CROSS REFERENCE TO RELATED APPLICATIONS

This application is a continuation of U.S. patent application Ser. No. 13/073,231, filed Mar. 28, 2011, which, in turn, is a continuation of U.S. patent application Ser. No. 11/631,103, filed May 8, 2007 as the U.S. National Stage of International Application No. PCT/JP05/011941, filed Jun. 29, 2005, the disclosures of which are incorporated herein by reference in their entireties. This application claims priority to Japanese Patent Application Number 2004-194509, filed Jun. 30, 2004, the disclosure of which is incorporated herein by reference in its entirety.

TECHNICAL FIELD

This invention relates to a light emitting device, and lighting system, display using the same.

BACKGROUND ART

Heretofore, a white-light emitting device constructed by combining a gallium nitride (GaN) base light-emitting diode (LED) as semiconductor light emitting device and phosphors as wavelength converting material has been noted as light source for a display or lighting system, making use of its advantages of low power consumption and long operating life.

As a typical light emitting device, a white LED comprising In-added GaN base blue LED and Ce-activated yttrium aluminium garnet base yellow phosphor can be cited particularly. However, there are problems, as already pointed, that the light amount in the range of red (600 nm or longer) and blue green (480 nm to 510 nm) is small, and that the general color rendering index Ra of the light from the light emitting device is low. Therefore, an improvement has been demanded.

To solve this problem, in Patent Document 1, it is disclosed that white LED emitting white composite light can be obtained by exciting, using blue LED, phosphor consisting of a red phosphor such as $(Ca_{1-a-b}Sr_a Eu_b)S:Eu^{2+}$, which is used for increasing red light component in addition to the light component of a green phosphor such as $(Y_{1-a-b}Gd_a Ce_b)_3(AL_{1-c}Ga_c)_5O_{12}$. It shows, in addition, a method of obtaining white light by means of adjusting the weight ratio of the green phosphor to be 40% to 80% of a mixture of the green and the red phosphors. The red phosphor used here is a substance which can be excited by the light emitted from a green phosphor. However, as the luminous efficiency of the red phosphor is lower than that of the green phosphor, when the mixture having the above-mentioned combination and weight ratio of these phosphors is used, the weight ratio of the red phosphor is necessary to be 20% to 60%, which is relatively much. This then leads to a problem of reduction in luminous flux emitted from the white LED because green light emitted from the green phosphor is absorbed by the large amount of the red phosphor, having low luminous efficiency. Moreover, as the red phosphor used is low moisture-resistant, sulfide base red phosphor, there are problems of ease of deterioration, and of high production cost due to the difficulty in synthesis. This leads to the problems of the white LED, which is obtained by using the red phosphor, of low durability and high production cost. Furthermore, as the color of the emitted light from the green phosphor used is a little too yellowish, there is another problem that the shortage of blue-green range of emitted light causes inferior color rendering. In non-Patent Document 1, white LED, using $SrGa_2S_4:Eu^{2+}$ as green phosphor and ZnCdS:Ag,Cl as red phosphor, is disclosed. There are problems, with this LED too, of insufficient luminous flux, insufficient color rendering and vulnerability of the sulfide to deterioration when the white LED is used.

[Patent Document 1] Japanese Patent Laid-Open Publication (Kokai) No. 2003-243715

[Non-Patent Document 1] J. Electrochem. Soc. Vol. 150 (2003) pp. H57-H60

DISCLOSURE OF THE INVENTION

Problem to be Solved by the Invention

The present invention has been made in view of the prior arts as mentioned above, aiming at creating a light emitting device which is excellent in both luminance and color rendering. Therefore, the object of the present invention is to provide a light emitting device which is excellent in both luminance and color rendering, and a lighting system and display using the same.

Means for Solving the Problem

The inventors of the present invention made an intensive investigation to solve the above problems, and found that, a light emitting device having excellent luminance and excellent color rendering can be obtained by using a mixture consisting of two or more kinds of phosphors whose luminous efficiency are 35% or higher when excited by the visible light from a semiconductor light emitting device at room temperature, wherein said mixture contains a first phosphor and a second phosphor that is different from said first phosphor and capable of absorbing emitted light from said first phosphor, and said first phosphor is contained 85 weight % or more of said mixture of phosphors, which leads to creation of the present invention.

Advantageous Effect of the Invention

The present invention makes possible the creation of a light emitting device which is excellent in both luminance and color rendering. The use of the light emitting device of the present invention makes possible the creation of a lighting system and a display which are excellent in both emission efficiency and color rendering.

BEST MODE FOR CARRYING OUT THE INVENTION

The present invention will now be explained in detail referring to examples. It should be borne in mind that the present invention is not limited to the below-described examples and can be modified any way insofar as it does not depart from the scope of the present invention.

A light emitting device of the present invention is equipped with phosphors as wavelength converting material; and a semiconductor light emitting device that emits visible light, wherein said phosphors are one or more kinds of phosphors selected from a group consisting of oxides, oxynitrides and nitrides, and are a mixture consisting of two or more kinds of phosphors whose luminous efficiency are 35% or higher when excited by the visible light from said semiconductor light emitting device at room temperature; and said mixture contains a first phosphor, and a second phosphor that is different from said first phosphor and capable of absorbing emitted light from said first phosphor, and said first phosphor is contained 85 weight % or more of said mixture of phosphors.

Material for the phosphors used in the present invention, is one or more kinds of phosphors selected from a group consisting of oxides, oxynitrides and nitrides. By using these materials, the light emitting device will not be vulnerable to deterioration when it is used, and will show high emission efficiency when the temperature of the phosphor becomes high under high-load light irradiation from, for example, a power LED. This leads to the preferable result of less vulnerability to deterioration and higher luminance. It is particularly preferable to use one or more kinds of phosphors selected from a group consisting of inorganic oxides, inorganic oxynitrides and inorganic nitrides, as the light emitting device is then quite hardly vulnerable to deterioration when it is used.

In addition, phosphors used in the present invention are a mixture consisting of two or more kinds of phosphors whose luminous efficiency are 35% or higher when excited by the visible light from said semiconductor light emitting device at room temperature. When a phosphor with luminous efficiency of below 35% is used, even if the efficiency of the semiconductor light emitting device which excites the phosphors, is high, the emission efficiency of the entire light emitting device, obtained by combining these, will be low, which is not a preferable consequence. The mixture of phosphors contains a first phosphor and a second phosphor that is different from said first phosphor and capable of absorbing emitted light from said first phosphor. In particular, the luminous efficiency of the first phosphor is preferably 40%; or higher, more preferably 45% or higher, and especially preferably 50% or higher, as the light emitted from the first phosphor is used for excitation of the second phosphor. The higher the luminous efficiency of the first phosphor is, the better. Similarly, the higher the luminous efficiency of the second phosphor is, the better. Actually, it is preferably 40% or higher, more preferably 45% or higher, and especially preferably 50% or higher.

In the following section, a method of calculating luminous efficiency, represented by the product of quantum absorption efficiency $\alpha_q$ and internal quantum efficiency $\eta_i$ will be described. First, the phosphor sample to be measured, in a state of powder or the like, is stuffed up in a cell with its surface smoothed enough to keep measurement accuracy to be high, and then it is set on a spectrophotometer having an integrating sphere or the like. As the spectrophotometer, can be cited for example MCPD2000 made by OTSUKA ELECTRONICS CO., LTD. The reason for the use of an integrating sphere or the like is to count all the photons both reflected from the sample and released from the sample by photoluminescence without fail, in other words, to prevent all the photons from going outside of measurement system without being counted. A light source for exciting the phosphor is attached on the spectrophotometer. This light source, for example an Xe lamp, is adjusted using a filter or the like so that the emission peak wavelength is 400 nm. By irradiating the sample to be measured with this light from the light source adjusted to have wavelength peak of 400 nm, the emission spectrum is measured. In the measured spectrum, there is actually also overlapped contribution of photons reflected from the sample, as well as photons produced from the sample by photoluminescence induced by the light from the excitation light source (hereinafter, called simply "excitation light"). Absorption efficiency $\alpha_q$ takes the value of $N_{abs}$, the number of photons included in the excitation light absorbed in the sample, divided by N, the number of all the photons of the excitation light. First, as for the latter value N, which shows the number of all the photons of the excitation light, is calculated as follows. The reflection spectrum $I_{ref}(\lambda)$ is measured about a material which is a measuring object installed on the spectrophotometer, and has reflectance R of approx. 100% against the excitation light, for example Spectralon, a reflection plate made by Labsphere (having 98 of reflectance against excitation light of 400 nm wavelength). The value calculated from the reflection spectrum $I_{ref}(\lambda)$ following to (formula 1) below is proportional to N.

[mathematical formula 1]

$$\frac{1}{R}\int \lambda \cdot I_{ref}(\lambda)d\lambda \qquad \text{(formula 1)}$$

In this formula, the integration may be performed at only such intervals that $I_{ref}(\lambda)$ take substantially significant values. Then, as for the former value $N_{abs}$, is proportional to the amount calculated by (formula 2).

[mathematical formula 2]

$$\frac{1}{R}\int \lambda \cdot I_{ref}(\lambda)d\lambda - \int \lambda \cdot I(\lambda)d\lambda \qquad \text{(formula 2)}$$

Here, the function $I(\lambda)$ is a reflection spectrum in case the target sample, whose $\alpha_q$ is intended to be decided, is set. The integration intervals of (formula 2) are the same as those selected in (formula 1). By restricting the integration intervals as above, the second term of (formula 2) corresponds to the number of photons produced by the reflection of excitation light from the target sample, or in other words, corresponds to the number of all photons produced from the target sample except for the number of photons produced by photoluminescence induced by the excitation light. As the actual measurement value of the spectrum is generally obtained as digital data which are divided by a certain finite band width which is related to $\lambda$, the integrations of (formula 1) and (formula 2) are calculated as finite sum, based on the band width. Consequently, $\alpha_q$ is calculated as the value of $N_{abs}/N$, which is equal to (formula 2)/(formula 1).

Next, a method of calculating internal quantum efficiency $\eta_i$ is explained. The letter $\eta_i$ takes the value of $N_{PL}$, the number of photons produced by photoluminescence, divided by $N_{abs}$/the number of photons absorbed in the sample. Here, $N_{PL}$ is proportional to the amount calculated by (formula 3).

[Mathematical Formula 3]

$$\int \lambda \cdot I(\lambda)d\lambda \qquad \text{(formula 3)}$$

At this point, the integral interval is restricted to the wavelength region of photons that are produced from the sample by photoluminescence so as to eliminate the contribution of photons, which are reflected from the sample, from the function $I(\lambda)$. More concretely, the lower interval limit of the (formula 3) integration takes the value of upper interval limit of (formula 1) integration, and the upper interval limit takes the value of the range which is preferable to include the spectra originated from photoluminescence. Consequently, $\eta_i$ can be decided as (formula 3)/(formula 2). Incidentally, the way to perform integration from spectra of digital data is the same as in the case where $\alpha_q$ is calculated.

Then, the luminous efficiency, defined in the present invention, is decided as product of quantum absorption efficiency $\alpha_q$ and internal quantum efficiency $\eta_i$, calculated in the way shown above.

It is preferable that the absorption efficiency of the second phosphor, at the wavelengths of light emitted from the semiconductor light emitting device, is larger than the absorption efficiency of the second phosphor, at the emission peak wavelength of the first phosphor. In such instance, the probability that the second phosphor emits light by excitation of the light which is emitted from the semiconductor light emitting device and absorbed in the second phosphor is higher than the probability that the second phosphor emits light by excitation of the light which is emitted from the first phosphor and absorbed in the second phosphor. This preferably leads to the result of obtaining a light emitting device having higher emission efficiency.

The light emitting device of the present invention, as mentioned previously, contains a mixture consisting of two or more kinds of phosphor whose luminous efficiency is 35% of higher. The mixture contains a first phosphor and a second phosphor that is different from said first phosphor and capable of absorbing emitted light from said first phosphor. At this point, the device contains said first phosphor with 85 weight % or more, relative to said mixture of phosphor, or more concretely, relative to the sum of the first and second phosphors. When the weight % of the first phosphor is below 85%, it is likely to create white LED having substantially much red in its color, instead of obtaining white LED having high luminance and preferable white color. To obtain more preferable white color, though it also depends on the balance of the luminous efficiency between the first and second phosphors or the absorption efficiency of the light emitted from the first phosphor into the second phosphor, the device preferably contains the first phosphor with 89 weight % or more. Furthermore, to obtain more solid white color, the weight % of the first phosphor is preferably 92 weight % or more.

To obtain a light emitting device having high luminance and high color rendering due to rich content of green and red light component, such phosphors are usually selected that the emission peak wavelength L1 of the first phosphor is in the range of 490 nm≤L1 ≤550 nm and that the emission peak wavelength L2 of the second phosphor is in the range of 600 nm≤L2 ≤700 nm. Further, it is preferable that the phosphors are selected so that the emission peak wavelength L1 of the first phosphor is in the range of 490 nm≤L1 ≤550 nm and that the emission peak wavelength L2 of the second phosphor is in the range of 600 nm≤L2 ≤700 nm.

With the combination of phosphors selected as above, in case these phosphors are excited by the light from a semiconductor light emitting device with peak wavelength of 380 nm to 480 nm in the visible light range, a light emitting device having almost all colors of emission spectra and therefore high color rendering can be obtained. It shows especially high luminance and color rendering, when the peak wavelength of the semiconductor light emitting device is in the blue light range, which is from 420 nm to 480 nm. And it shows the highest luminance and color rendering, when the peak wavelength of the semiconductor light emitting device is in the pure blue light range, which is from 435 nm to 465 nm.

The general color rendering index Ra of the light from the light emitting device of the present invention, releasing white light having high luminance and high color rendering, is preferably 80 or larger, and particularly preferably 85 or larger. With the most ideal combination of semiconductor light emitting device and phosphors, Ra is so high as to be 88 or larger. Incidentally, the maximum value of Ra is 100.

When the emission peak wavelength L1 of the first phosphor is below or over the aforesaid range of 490 nm≤L1≤550 nm, or when the emission peak wavelength L2 of the second phosphor is below or over the aforesaid range of 600 nm≤L2≤700 nm, the light emitting device obtained will be of inferior luminance and color rendering, which is not preferable. For the same reason, it is more preferable that the emission peak wavelength L1 of the first phosphor is in the range of 500 nm≤L1≤540 nm, and that the emission peak wavelength L2 of the second phosphor is in the range of 610 nm≤L2≤670 nm. Moreover, it is particularly preferable that the emission peak wavelength L1 of the first phosphor is in the range of 510 nm≤L1≤540 nm, and that the emission peak wavelength L2 of the second phosphor is in the range of 620 nm≤L2≤660 nm, because the color reproduction range thereof will be large when used for display, as well as having intensified green or red light, high luminance and high color rendering.

In the following, examples of first phosphor and second phosphor used for the light emitting device of the present invention, will be described. It should be noted that phosphors are not limited to those exemplified in the following section.

As a first phosphor, can be cited the phosphor which contains at least Ce as luminescent center ion in the host crystal described by the general formula (1) or (2) below. It is particularly preferable that the first phosphor contains at least one of the phosphors, from the standpoint of obtaining a light emitting device having high luminance and color rendering, because of its less vulnerability to deterioration at the point of use and less variation of luminance according to the temperature variation of the light emitting device when used.

In the following, the general formula (1) above will be described.

$M^1$, $M^2$, and $M^3$ represent at least one bivalent metal element, at least one trivalent metal element and at least one tetravalent metal element, respectively, and a, b, c and d indicate values in the range shown below.

2.7≤a≤3.3

1.8≤b≤2.2

2.7≤c≤3.3

11.0≤d≤13.0

In the formula (1) above, $M^1$ is at least one bivalent metal element. In view of light luminous efficiency or the like, it is preferably at least one of elements selected from the group consisting of Mg, Ca, Zn, Sr, Cd and Ba, more preferably at least one element selected from Mg, Ca and Zn. Ca is particularly preferable. In this instance, Ca can be used either singly or in combination with Mg. In principle, $M^1$ should consist of the elements referred to above as preferable. However, it can contain other bivalent metal elements, as far as performance is not impaired.

In the formula (1) above, $M^2$ is at least one trivalent metal element. In view of the same aspects as above, it is preferably at least one of elements selected from the group consisting of Al, Sc, Ga, Y, In, La, Gd and Lu, more preferably at least one element selected from Al, Sc, Y and Lu. Sc is particularly preferable. In this instance, Sc can be used either singly or in combination with Y or Lu. In principle, $M^2$ should consist of the elements referred to above as preferable. However, it can contain other trivalent metal elements, as far as performance is not impaired.

In the formula (1) above, $M^3$ is at least one tetravalent metal element. In view of the same aspects as above, it is preferable that $M^3$ contains Si as a minimum requirement. The content of Si in the tetravalent metal element shown as $M^3$ is usually 50 mole % or more, preferably 70 mole % or more, more preferably 80 mole % or more, far more preferably 90 mole % or more. Apart from Si, tetravalent metal element $M^3$ is preferably at least one of element selected from the group consisting of Ti, Ge, Zr, Sn and Hf, more preferably at least one element selected from the group consisting of Ti, Zr, Sn and Hf. Of these, Sn is particularly preferred. The particularly preferred $M^3$ element is Si. In principle, $M^3$ should consist of the elements referred to above as preferable. However, it can contain other tetravalent metal elements, as far as performance is not impaired.

In the present invention, performance is deemed not impaired if the content of other elements, relative to above-mentioned $M^1$, $M^2$ and $M^3$, is 10 mole % or lower, preferably 5 mole % or lower, more preferably 1 mole % or lower.

In the formula (1) above, a, b, c and d fall within the following range: $2.7 \leq a \leq 3.3$, $1.8 \leq b \leq 2.2$, $2.7 \leq c \leq 3.3$ and $11.0 \leq d \leq 13.0$, respectively, a, b, c and d of the present phosphor may deviate within the above range, in such case that the element constituting the luminescent center ion occupies the position of the crystal lattice of one of the metal ions of $M^1$, $M^2$, and $M^3$, or that it is located in the interstitial gap of the crystal lattice. However the crystal structure of the present phosphors is one of the garnet crystal structures. This is usually a body centered cubic lattice crystal structure where a, b, c and d represent the value of 3, 2, 3 and 12, respectively.

The luminescent center ion, contained in the host material of the crystal structure, is required to contain at least Ce. For the fine adjustment of its luminescence property, it may contain, as coactivator agent, at least one type of divalent to tetravalent element selected from the group consisting of Cr, Mn, Fe, Co, Ni, Cu, Pr, Nd, Sm, Eu, Tb, Dy, Ho, Er, Tm and Yb. Particularly, it may contain at least one type of divalent to tetravalent element selected from the group consisting of Mn, Fe, Co, Ni, Cu, Sm, Eu, Tb, Dy and Yb. Divalent Mn, divalent or trivalent Eu, or trivalent Tb may be preferably added. In case coactivator agent is contained, the amount of the coactivator agent is usually 0.01 mol to 20 mol relative to 1 mol of Ce.

In case the concentration of Ce, which functions as activator agent, is too low, there is too little activator agent, which emits light, and this may result in the lowering of emission intensity. On the other hand, if the concentration is too high, the extent of concentration quenching may be heightened, resulting in the lowering of emission intensity. In terms of emission intensity, the concentration of Ce is, in molar ratio, preferably in the range of 0.0001 to 0.3, relative to 1 mol of $M^1$. It is more preferably in the range of 0.001 to 0.1, and far more preferably in the range of 0.005 to 0.05.

In the following, the general formula (2) below will be described.

$$M^4{}_e M^5{}_f O_g \qquad (2)$$

$M^4$ and $M^5$ in the Formula (2) represent at least one bivalent metal element and at least one trivalent metal element, respectively, and e, f and g indicate values in the range shown below, respectively.

$$0.9 \leq e \leq 1.1$$

$$1.8 \leq f \leq 2.2$$

$$3.6 \leq g \leq 0.4$$

In the formula (2) above, $M^4$ is at least one bivalent metal element. In view of light luminous efficiency or the like, it is preferably at least one type of element selected from the group consisting of Mg, Ca, Zn, Sr, Cd and Ba, more preferably one element selected from Mg, Ca and Zn. Ca is particularly preferable. In this instance, Ca can be used either singly or in combination with Mg. In principle, $M^4$ should consist of the elements referred to above as preferable. However, it can contain other bivalent metal elements, as far as performance is not impaired.

In the formula (2) above, $M^5$ is a trivalent metal element. In view of the same aspects as above, it is preferably at least one of elements selected from the group consisting of Al, Sc, Ga, Y, In, La, Gd and Lu, more preferably at least one element selected from Al, Sc, Y and Lu. Sc is particularly preferable. In this instance, Sc can be used either singly or in combination with Y or Lu. In principle, $M^5$ should consist of the elements referred to above as preferable. However, it can contain other trivalent metal elements, as far as performance is not impaired.

In the present invention, performance is deemed not impaired if the content of other elements, relative to above-mentioned $M^4$ and $M^5$, is 10 mole % or lower, preferably 5 mole % or lower, more preferably 1 mole % or lower.

It is preferable that the element ratio is in the range described below, from the standpoint of luminescence property. Especially with respect to the concentration of Ce, which functions as activator agent, in case it is too low, there is too little activator agent, which emits light, and this may result in the lowering of emission intensity. On the other hand, if the concentration is too high, the extent of concentration quenching may be heightened, resulting in the lowering of emission intensity. In terms of emission intensity, the concentration of Ce is, in molar ratio, preferably in the range of 0.0001 to 0.3, relative to 1 mol of $M^4$. It is more preferably in the range of 0.001 to 0.1, and far more preferably in the range of 0.005 to 0.05.

The luminescent center ion, contained in the host material of the crystal structure, is required to contain at least Ce. For the fine adjustment of its luminescence property, it may contain, as coactivator agent, at least one type of divalent to tetravalent element selected from the group consisting of Cr, Mn, Fe, Co, Ni, Cu, Pr, Nd, Sm, Eu, Tb, Dy, Ho, Er, Tm and Yb. Particularly, it may contain at least one type of divalent to tetravalent element selected from the group consisting of Mn, Fe, Co, Ni, Cu, Sm, Eu, Tb, Dy and Yb. Divalent Mn, divalent or trivalent Eu, or trivalent Tb may be preferably added. In case coactivator agent is contained, the amount of the coactivator agent is usually 0.01 mol to 20 mol relative to 1 mol of Ce.

In the following section, second phosphor will be described. Though there is no special limitation on second phosphor, as far as it can absorb the light emitted from the above-mentioned first phosphor, it is particularly preferable for obtaining light emitting device having high luminance and color rendering that it contains at least a composition including M element, A element, D element, E element and X element (M represents one or more than one elements selected from the group consisting of Mn, Ce, Pr, Nd, Sm, Eu, Tb, Dy, Ho, Er, Tm and Yb. It contains Eu as a minimum requirement. A represents one or more than one elements selected from the group consisting of bivalent metal elements other than M element. D represents one or more than one elements selected from the group consisting of tetravalent metal elements. E represents one or more than one elements selected from trivalent metal elements. X represents one or more than one elements selected from the group consisting of O, N, and F), because of its less vulnerability to deterioration at the point of use and less variation of luminance according to the temperature variation of the light emitting device when used.

At this point, M represents one or more than one elements selected from the group consisting of Mn, Ce, Pr, Nd, Sm, Eu, Tb, Dy, Ho, Er, Tm and Yb. It contains Eu as a minimum requirement. More preferably, M represents one or more than one elements selected from the group consisting of Mn, Ce, Sm, Eu, Tb, Dy, Er, and Yb. Eu is the particularly preferable element.

A represents one or more than one elements selected from the group consisting of bivalent metal elements other than M. Preferably, it represents one or more than one elements selected from the group consisting of Mg, Ca, Sr and Ba. Particularly preferable is Ca.

D represents one or more than one elements selected from the group consisting of tetravalent metal elements. Preferably, it represents one or more than one elements selected from the group consisting of Si, Ge, Sn, Ti, Zr and Hf. Si is the particularly preferable element.

E represents one or more than one elements selected from the group consisting of trivalent metal elements. Preferably, it represents one or more than one elements selected from the group consisting of B, Al, Ga, In, Sc, Y, La, Gd and Lu. Al is the particularly preferable element.

X represents one or more than one elements selected from the group consisting of O, N, and F. Particularly preferred is N or a combination of N and O.

A concrete composition of the above-described composition can be represented by general formula (3) below, for example.

$$M_a A_b D_c E_d X_e \quad (3)$$

In the formula (3) above, a, b, c, d and e indicate a value satisfying all the conditions shown below.

$0.00001 \leq a \leq 0.1$ (i)

$a+b=1$ (ii)

$0.5 \leq c \leq 4$ (iii)

$0.5 \leq d \leq 8$ (iv)

$0.8 \times (2/3 + 4/3 \times c + d) \leq e$ (v)

$e \leq 1.2 \times (2/3 + 4/3 \times c + d)$ (vi)

Here, index a represents the addition amount of M element which plays the role of luminescent center. It is preferable to set index a, the ratio of the number of M atom to the number of (M+A) element in the phosphor (a=(number of M atom/(number of M atom+number of A atom)), at 0.00001 or larger, and 0.1 or smaller. If the value of a is smaller than 0.00001, the number of M element constituting the luminescent center is small and this results in the lowering of emission luminance. If the value of a is larger than 0.1, concentration quenching due to interaction among M ions themselves may occur, resulting in the lowering of luminance.

In case the M element is Eu, it is preferable that the value a is set in the range of 0.002 or larger, and 0.03 or smaller, as it can have high emission luminance then.

The value c represents the content of D element such as Si, and falls in the range of $0.5 \leq c \leq 4$. Preferably, the value of c is in the range $0.5 \leq c \leq 1.8$, more preferably c is 1. Emission luminance decreases in case the value of c is smaller than 0.5, and in case it is larger than 4. In the range $0.5 \leq c \leq 1.8$, emission luminance is high. It is particularly high in case the value of c is 1.

The value d represents the content of E element such as Al and falls in the range of $0.5 \leq d \leq 8$. Preferably, the value of d is in the range $0.5 \leq d \leq 1.8$, more preferably d is 1. Emission luminance decreases in case the value of d is smaller than 0.5, and in case it is larger than 8. In the range $0.5 \leq d \leq 1.8$, emission luminance is high. It is particularly high in case the value of d is 1.

The value e represents the content of X element such as N. The value of e is larger than or equal to $0.8 \times \{(2/3)+(4/3) \times c + d\}$, and smaller than or equal to $1.2 \times \{(2/3)+(4/3) \times c + d\}$. It is more preferable that e takes the value of 3. In case the value deviates outside the above range, emission luminance decreases.

Of the compositions mentioned above, the preferable composition ensuring high emission luminance is such that it contains Eu as M element, Ca as A element, Si as D element, Al as E element, and N as X element as a minimum requirement. It is particularly preferable that it is an inorganic compound in which M element is Eu, A element is Ca, D element is Si, E element is Al, and X element is N or a mixture of N and O.

In case X element is N or a mixture of N and O, too large value of (number of moles of O)/(number of moles of N+number of moles O) lowers emission intensity. In terms of emission intensity, the value of (number of moles of O)/(number of moles of N+number of moles O) is preferably 0.5 or smaller, and more preferably 0.3 or smaller. It is far more preferably 0.1 or smaller, as the red phosphor can emit light with emission peak wavelength of 640 nm to 660 nm, which means excellent color purity. From another viewpoint, it is also preferable to set the value of (number of moles of O)/(number of moles of N+number of moles O) to be 0.1 to 0.3, as the emission peak wavelength can be adjusted in the range of 600 nm to 640 nm, which is close to the wavelength region with high visual sensitivity by human, and therefore, a light emitting device having high luminance can be obtained.

With respect to the mixture of phosphors, on which is irradiated with the light from semiconductor light emitting device, it is preferable to adjust the mixing ratio between first phosphor and second phosphor incrementally or continuously, depending on the distance from the semiconductor light emitting device, in such a manner that the longer the distance is, the higher the mixing ratio of the first phosphor is.

In other words, when the first and second phosphors are mixed and disposed at the portion where the light from the semiconductor light emitting device is directly irradiated, it is preferable that the first phosphor is contained in the mixture of phosphors with relatively low mixing ratio where it is close to the semiconductor light emitting device and the light from the semiconductor light emitting device is directly irradiated, and that the first phosphor is contained in the mixture of phosphor with relatively high mixing ratio where it is far from the semiconductor light emitting device and the light from it is not directly irradiated. With this gradation of the mixing ratio of phosphors, a part of the light from the semiconductor light-emitting can be absorbed first into the portion with large amount of second phosphor contained and excite the second phosphor intensively, and then the rest part of the light, which is not absorbed in the second phosphor, can excite the phosphor mixture with more mixing ratio of first phosphor. This leads to high luminous efficiency of the entire phosphor.

To obtain a light emitting device that can release white light with high luminance and color rendering, it is preferable that the device contains a mixture of phosphors wherein the color coordinate of the emitted light from said mixture of phosphors, when it is irradiated by the emitted light from said semiconductor light emitting device, is in the range surrounded by the quadrangle with apexes having CIE color coordinates (0.450, 0.350), (0.550, 0.450), (0.400, 0.600), and (0.300, 0.500). If a mixture of phosphors whose color coordinate is out of this range is used and it is incorporated with a semiconductor light emitting device emitting blue light, it is difficult to obtain white light. And to obtain a light emitting device emitting more solid white light, the color coordinate of the emitted light from said mixture of phosphors is more preferably in the range surrounded by the quadrangle with apexes (0.500, 0.400), (0.550, 0.450), (0.400, 0.600), and (0.320, 0.520), and it is far more preferably in the range surrounded by the quadrangle with apexes (0.480, 0.420), (0.520, 0.480), (0.410, 0.590), and (0.340, 0.520).

Moreover, in the present light emitting device, in order to obtain white range of light having high luminance, high chromaticity and high color rendering, it is preferable to adjust the emission wavelength of the semiconductor light emitting device, mixing ratio of the phosphors and coating amount of the phosphor onto semiconductor light emitting device in such a manner that the color coordinate of a composite light consisting of emitted light from said semiconductor light emitting device and emitted light from said mixture of phosphors, which is excited by the emitted light from said semiconductor light emitting device, is in the range surrounded by the quadrangle with apexes having CIE color coordinates (0.275, 0.175), (0.450, 0.400), (0.350, 0.450), and (0.175, 0.250). For similar reason, it is more preferable to adjust the emission wavelength of the semiconductor light emitting device, mixing ratio of the phosphors and coating amount of the phosphors in such a manner that the color coordinate of the composite light of the light emitting device is in the range surrounded by the quadrangle with apexes having color coordinates (0.278, 0.210), (0.410, 0.385), (0.353, 0.420) and (0.215, 0.265), far more preferably, it is in the range surrounded by the quadrangle with apexes having color coordinates (0.280, 0.250), (0.370, 0.370), (0.355, 0.390) and (0.255, 0.275), and most preferably, it is in the range surrounded by the quadrangle with apexes having color coordinates (0.295, 0.275), (0.340, 0.330), (0.330, 0.340) and (0.285, 0.295).

The light emitting device of the present invention contains at least two kinds of phosphors as wavelength converting material and at least one semiconductor light emitting device that emits visible light, for example LED, LD or the like, and it contains phosphors that absorb visible light emitted from the semiconductor light emitting device and emits visible light with longer wavelengths, which leads to high luminance and color rendering. Consequently, it can be preferably used as light source of display such as color liquid crystal display, lighting systems such as surface emitting type, or the like.

Figure 1:
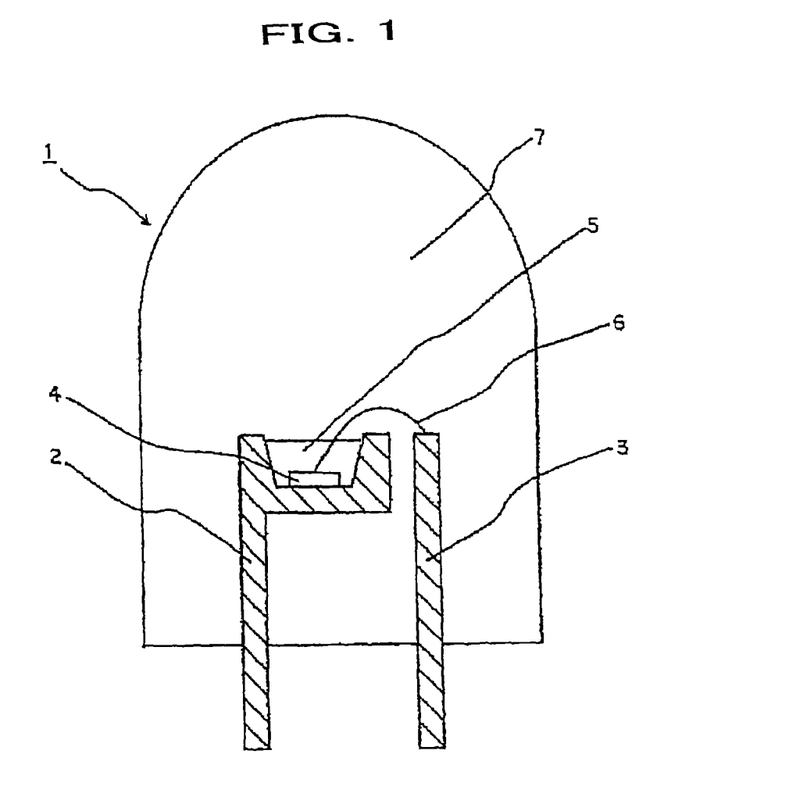
FIG. 1 is a schematic cross-sectional view illustrating one example of a light emitting device of the present invention comprising phosphors as wavelength converting material and a semiconductor light emitting device.
Figure 2:
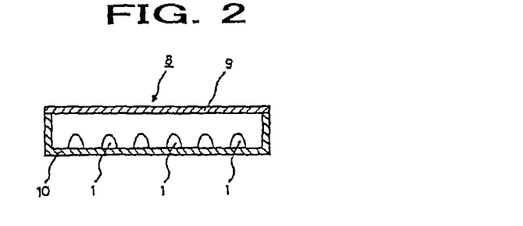
FIG. 2 is a schematic cross-sectional view illustrating one example of a surface-emitting lighting system incorporated with the light emitting device shown in FIG. 1.

In the following, light emitting device of the present invention is explained referring to the drawings. FIG. 1 is a schematic cross-sectional view illustrating one example of a light emitting device comprising phosphors as wavelength converting material and a semiconductor light emitting device. FIG. 2 is a schematic cross-sectional view illustrating one example of a surface-emitting lighting system incorporated with the light emitting device shown in FIG. 1. In FIG. 1 and FIG. 2, the letter 1 shows light emitting device, 2 shows mount lead, 3 shows inner lead, 4 shows semiconductor light emitting device, 5 shows phosphor-containing resin portion, 6 shows conductive wire, 7 shows molded member, 8 shows surface-emitting lighting system, 9 shows diffusion plate and 10 shows support case.

The light emitting device 1 of the present invention is in a common, shell type, as illustrated in FIG. 1. In a cup-like portion at the top of mount lead 2, semiconductor light emitting device 4 consisting of a GaN base blue light-emitting diode is fixed by being covered with phosphor-containing resin portion 5. The phosphor-containing resin portion 5 is formed by mixing and dispersing phosphor of the present invention into a binder, such as epoxy resin, acrylic resin or the like, and poring it into the cup-like portion. On the other hand, semiconductor light emitting device 4 and mount lead 2 are electrically connected through mounting member such as silver paste, and semiconductor light emitting device 4 and inner lead 3 are electrically connected through conductive wire 6. All of these members are covered and protected with molded member 7, formed from epoxy resin or the like.

Surface-emitting lighting system 8 incorporated with this light emitting device 1 is constructed, as shown in FIG. 2, so that a lot of light emitting devices 1 are disposed on the bottom of rectangular support case 10, whose inner surfaces are light-impermeable ones such as white and flat surfaces, provided with power sources, circuits or the like (not shown in the drawings) for driving light emitting device 1 on outer ends of the devices 1, and that diffusion plate 9, such as an opalescent acrylic plate, is fixed at the portion which corresponds to the lid of support case 10 so as to emit light uniformly.

When this surface-emitting lighting system 8 is driven, the voltage applied to semiconductor light emitting device 4 of light emitting device 1 makes light such as blue light be emitted, and then a part of the emitted light is absorbed in the mixture of phosphors which functions as wavelength converting material in phosphor-containing resin portion 5, leading to emission of light with longer wavelengths. On the other hand, this light emitted, mixed with light, such as the blue light, which is not absorbed in the phosphors, produce light with high color rendering. This light is released through diffusion plate 9 in the upward direction in the drawing, leading to realizing illuminating light which has uniform luminance over the plane of diffusion plate 9 of support case 10.

The present invention will be explained in further detail below referring to examples. It is to be understood that the present invention is not limited to specific examples explained below as far as it is not departed from the scope thereof.

EXAMPLE 1

A first phosphor and a second phosphor were mixed, with weight % of 94 and 6 respectively, to create a mixture of phosphors. The first phosphor used, represented by the chemical composition of $Ca_3Sc_2Si_3O_{12}$ was a phosphor of an oxide, which has luminous efficiency of 46% and emission peak wavelength of 505 nm, and includes 0.03 mol (0.01 mol relative to 1 mol of Ca in the chemical composition) of Ce as activator agent. The second phosphor used, represented by the chemical composition of $CaAlSiN_3$, was a phosphor of a nitride, which has luminous efficiency of 54% and emission peak wavelength of 650 nm, and includes 0.01 mol of Eu as activator agent.

This intensive emission peak observed in the emission spectrum of the first phosphor is sufficiently overlapped with wavelength of the excitation band observed in the excitation spectrum of the second phosphor. Therefore, it was confirmed that the light emitted from the first phosphor was absorbed in the second phosphor and excited the second phosphor.

Then, this mixture of phosphor was irradiated with blue light emitted from In added GaN base semiconductor light emitting device with emission peak wavelength of 460 nm, this resulted in that the phosphor emitted light with CIE color coordinate (x, y) of (0.420, 0.500).

Furthermore, shell type white LED was produced by the following procedure. First, an LED (C460XT, made by Cree), which emits light at 460 nm of wavelength, was mounted on a cup-like portion of a frame of the shell type LED using a conductive silver paste as mounting member. Then, the electrode of the LED and inner lead were connected by bonding using Au wire. Then, a mixture of phosphors and resin (hereinafter, it is called "phosphor paste") was prepared by mixing well the above described phosphors and epoxy resin with the ratio of 1 gram to 10 grams. The paste was poured in the cup-like portion of the frame where the LED was mounted. By maintaining this at 120° C. for an hour, the epoxy resin was cured. Next, the frame with the LED and the phosphors installed as mentioned above was inserted in a shell type mold having epoxy resin poured therein, and then it was maintained at 120° C. for an hour. After the resin was cured, it was demolded, and consequently, shell type white LED was obtained.

Electric current of 20 mA was supplied to the white LED obtained as above at room temperature (approx. 24° C.). All the light emitted from the white LED was measured for the emission spectrum, by receiving all of it with an integrating sphere and guiding it to a spectroscope through an optical fiber. The data of the emission spectrum were recorded as numerical values of emission intensity at 5 nm intervals in the range from 380 nm to 780 nm. In the result, the white LED showed high luminescence property including color temperature of 6800 K, CIE color coordinates (x, y) of (0.309, 0.318), general color rendering index Ra of 90 and whole luminous flux of 2.5 lm.

This white LED showed excellent light emission with outstandingly high general color rendering index and whole luminous flux compared to the conventional product of pseudo-white LED, which is constructed by combining blue LED and yttrium aluminium garnet base phosphor and has general color rendering index of 79 and whole luminous flux of 1.9 lm.

Therefore, it was found that the use of light emitting device of the present invention makes it possible to create a display having high luminance and wide color reproduction range relative to the conventional products, and a lighting system having high luminance and color rendering.

EXAMPLE 2

A first phosphor with weight % of 95 and a second phosphor were mixed, to create a mixture of phosphors. The first phosphor used, represented by the chemical composition of $CaSc_2O_4$, was a phosphor of an oxide, which has luminous efficiency of 43% and emission peak wavelength of 516 nm, and includes 0.01 mol of Ce as activator agent. The second phosphor used, represented by the chemical composition of $CaAlSiN_3$, was a phosphor of a nitride, which has luminous efficiency of 54% and emission peak wavelength of 650 nm, and includes 0.01 mol of Eu as activator agent.

This intensive emission peak observed in the emission spectrum of the first phosphor is sufficiently overlapped with wavelength of the excitation band observed in the excitation spectrum of the second phosphor. Therefore, it was confirmed that the light emitted from the first phosphor was absorbed in the second phosphor and excited the second phosphor.

Then, this mixture of phosphor was irradiated with blue light emitted from In added GaN base semiconductor light emitting device with wavelength of 460 nm, this resulted in that the phosphor emitted light with CIE color coordinate (x, y) of (0.420, 0.495).

Furthermore, shell type white LED was produced by the same procedure as shown in example 1, and the luminescence property was measured.

In the result, this white LED showed the luminescence property including color temperature of 6400 K, CIE color coordinates (x, y) of (0.320, 0.320), general color rendering index Ra of 89 and whole luminous flux of 2.3 lm. Of these, general color rendering index and whole luminous flux were outstandingly high compared to the conventional pseudo-white LED, this meant that excellent light emission could be obtained.

Therefore, it was found that the use of light emitting device of the present invention makes it possible to create a display having high luminance and wide color reproduction range relative to the conventional products and a lighting system having high luminance and high color rendering.

INDUSTRIAL APPLICABILITY

The present invention can be applied in any field where light is involved. It is preferably used, for example, as lighting system used indoors as well as outdoors, and a display for various electronic appliances such as cellular phone, electric appliances for household use, display to be installed outdoors.

Although the present invention was explained in detail referring to certain embodiments, it is evident for those skilled in the art that various changes or modifications can be made thereto without departing from the spirit and scope of the present invention.

The present invention is based on the specification of Japanese Patent Application No. 2004-194509 filed on Jun. 30, 2004, and its entirety is hereby included by reference.

The invention claimed is:

1. A composition, comprising:
a mixture of a first phosphor, and a second phosphor that is different from the first phosphor; and
a resin;
wherein:
each of the first phosphor and the second phosphor is independently selected from the group consisting of oxides, oxynitrides, and nitrides;
each of the first phosphor and the second phosphor has a luminous efficiency of 35% or higher when excited by visible light from a semiconductor light emitting device at room temperature;
the second phosphor is capable of absorbing emitted light from the first phosphor;
the first phosphor is present in the mixture of phosphors in an amount of at least 85% by weight;

the second phosphor has the following formula (3):

$$M_a A_b D_c E_d X_e \quad (3)$$

wherein:
M is Eu and optionally at least one element selected from the group consisting of Mn, Ce, Pr, Nd, Sm, Tb, Dy, Ho, Er, Tm, and Yb;
A is selected from the group consisting of bivalent metal elements other than M;
D is at least one element selected from the group consisting of tetravalent metal elements;
E is at least one element selected from the group consisting of trivalent metal elements;
X is at least one element selected from the group consisting of O, N, and F; and
a, b, c, d, and e satisfy the following conditions:

$$a+b=1;$$

$$0.00001 \leq a \leq 0.1;$$

$$0.5 \leq c \leq 1.8;$$

$$0.5 \leq d \leq 1.8;$$

$$0.8 \times (2/3 + 4/3 \times c + d) \leq e; \text{ and}$$

$$e \leq 1.2 \times (2/3 + 4/3 \times c + d).$$

2. The composition of claim 1, wherein:
an emission peak wavelength L1 of the first phosphor is in a range of 490 nm≤L1≤550 nm; and
an emission peak wavelength L2 of the second phosphor is in a range of 600 nm≤L2≤700 nm.

3. The composition of claim 1, wherein A is at least one element selected from the group consisting of Mg, Ca, Sr and Ba.

4. The composition of claim 1, wherein:
A is at least one element selected from the group consisting of Mg, Ca, Sr and Ba;
D is at least one element selected from the group consisting of Si, Ge, Sn, Ti, Zr and Hf; and
E is at least one element selected from the group consisting of B, Al, Ga, In, Sc, Y, La, Gd and Lu.

5. The composition of claim 1, wherein
M comprises Eu;
A comprises Ca;
D comprises Si;
E comprises Al; and
X comprises N.

6. The composition of claim 1, wherein
M is Eu;
A is Ca;
D is Si;
E is Al; and
X is N or a mixture of N and O.

7. A light emitting device, comprising the composition of claim 1.

8. A cured product, comprising the composition of claim 1, wherein the resin is cured.

9. A light emitting device, comprising:
the cured product of claim 8; and
at least one semiconductor light emitting device that emits visible light.

10. The light emitting device of claim 9, wherein a color coordinate (x, y) of light emitted by the mixture of phosphors is within a range defined by a quadrangle with apexes having CIE color coordinates (0.450, 1.350), (0.550, 0.450), (0.400, 0.600), and (0.300, 0.500), when the mixture of phosphors is irradiated by the emitted light from the semiconductor light emitting device.

11. The light emitting device of claim 9, wherein a color coordinate of a composite of light emitted by the semiconductor light emitting device and light emitted by the mixture of phosphors when excited by the emitted light from the semiconductor light emitting device, is in a range defined by a quadrangle with apexes having CIE color coordinates (0.275, 0.175), (0.450, 0.400), (0.350, 0.450), and (0.175, 0.250).

12. A lighting system, comprising the light emitting device of claim 9.

13. A display, comprising the light emitting device of claim 9.

14. A surface-emitting lighting system, comprising:
a light-impermeable rectangular support case having an open top;
a diffusion plate fixed on the rectangular support case to cover the open top; and
the light emitting device of claim 9 disposed on a bottom interior surface of the rectangular support case.

15. A light emitting device, comprising:
a cup-shaped portion;
a semiconductor light emitting device that emits visible light; and
a cured product;
wherein:
the semiconductor light emitting device is fixed in the cup-shaped portion;
the cured product covers the semiconductor light emitting device in the cup-shaped portion; and
the cured product is obtained by pouring the composition of claim 1 into the cup-shaped portion and curing the resin.

* * * * *